US007221167B2

(12) United States Patent
Klippel et al.

(10) Patent No.: US 7,221,167 B2
(45) Date of Patent: May 22, 2007

(54) SIGNAL DISTORTION MEASUREMENT AND ASSESSMENT SYSTEM AND METHOD

(75) Inventors: Wolfgang Klippel, Dresden (DE); Ulf Seidel, Dresden (DE)

(73) Assignee: Klippel GmbH, Dresden (DE)

( * ) Notice: Subject to any disclaimer, the term of this patent is extended or adjusted under 35 U.S.C. 154(b) by 876 days.

(21) Appl. No.: 10/376,080

(22) Filed: Feb. 28, 2003

(65) Prior Publication Data

US 2003/0187636 A1 Oct. 2, 2003

(30) Foreign Application Priority Data

Mar. 30, 2002 (DE) ................................ 102 14 407

(51) Int. Cl.
*G01R 23/20* (2006.01)
*G01R 29/26* (2006.01)

(52) U.S. Cl. ........................................ 324/626; 702/69

(58) Field of Classification Search ................ 324/620, 324/613, 76.11, 76.74, 626; 702/69; 703/2
See application file for complete search history.

(56) References Cited

U.S. PATENT DOCUMENTS 3,404,338 A * 10/1968 Cannon ...................... 324/620
3,978,401 A * 8/1976 Lum .......................... 324/620
4,275,348 A * 6/1981 Bayer et al. ................ 324/615
5,608,331 A * 3/1997 Newberg et al. ............ 324/613
2003/0171901 A1* 9/2003 Salsbury ........................ 703/2
2005/0210354 A1* 9/2005 Kurokami .................. 714/747
2006/0133470 A1* 6/2006 Raz et al. .................. 375/232
2006/0161361 A1* 7/2006 Tabatabaei .................. 702/69

* cited by examiner

*Primary Examiner*—Anjan Deb
(74) *Attorney, Agent, or Firm*—Koppel, Patrick, Heybl & Dawson

(57) ABSTRACT

The invention relates to an arrangement for measuring and assessing properties of a system (28) which transfers an electrical, mechanical or acoustical signal or converts an excitation signal x into another signal y. An error system (30) models the transfer behavior of the system, estimates a desired output signal y', and generates an error signal e which reveals the excess distortion and disturbances of the output signal y at any time instant t, and can reveal peak values of transient distortion having low power which might otherwise be masked by noise and regular distortion. The error signal is supplied to an assessment system (44), where convenient distortion measures are calculated and the distortion is displayed versus properties of the signal (e.g., instantaneous frequency and amplitude). The assessment system may also generate a control output (42) to modify signal x to ensure an optimal excitation of the system.

11 Claims, 5 Drawing Sheets

SIGNAL DISTORTION MEASUREMENT AND ASSESSMENT SYSTEM AND METHOD

BACKGROUND OF THE INVENTION

1. Field of Invention

The invention relates generally to an arrangement and a method for measuring and assessing properties of a system which transfers an electrical, mechanical or acoustical signal, or converts such a signal into another signal. The system is characterized to have at least one signal input and at least one signal output. Examples of such systems include an electro-acoustical transducer (loudspeaker, actuator, head phones), a converter between the analog and digital domain, storage media for audio data (CD, mini-disc), and wired and wireless communication systems (fiber optics, high frequency transmission).

2. Description of Related Art

A signal which is converted, transferred or stored in a system can be subject to distortion caused by properties of the system (e.g. inherent nonlinearities) and their interaction with the transferred signal. Additional stochastic disturbances may be caused by noise, ambient sound, or loose connections, which are not directly related to the transferred signal. Traditional techniques developed for assessing the signal distortion typically require providing a special excitation signal (single tone, multi-tone complex), measuring the output signal of the system, and transforming the time signal into the frequency domain to search for additional components in the output spectrum which are not part of the excitation signal. This technique makes it possible to identify harmonic and intermodulation components at multiples of the excitation frequencies, and at any combinations of the difference and sum frequencies. Distortion measures standardized by national and international organizations assess the amplitude of the distortion components, whereas the phase of the distortion component is neglected. The second-order and third-order distortion, total harmonic distortion and other simple measures are sufficient in most cases. For example, these measures are commonly used to assess the effects of regular loudspeaker nonlinearities (motor and suspension nonlinearity, nonlinear radiation) which are directly related to their principle of operation.

A conventional signal distortion measurement system of this type is shown schematically in FIG. 1, which provides a traditional measurement of signal distortion generated by a system under test 1 by using a spectral analysis (FFT). This technique may be applied if the stimulus contains a limited number of tones and each distortion component may be separated from the fundamental tones and identified as a harmonic or intermodulation component. Typically, this method uses a signal generator 2 which generates a single tone, a sensor or measurement input 4, an analog/digital converter (ADC) 6, a FFT analyzer 8 and a block 10 for calculating the relative distortion $d_r$ in percent.

However, there other types of signal loudspeaker distortion which are quite audible, but which can not be reliably detected by traditional measures. These kinds of distortion are mainly caused by anomalies and defects caused by problems in design or manufacturing. For example, loudspeakers may have defects such as a loose glue joint producing a buzzing sound, a voice coil rubbing on the pole tips, or any obstacle hitting the moving assembly and generating a small click. This class of signal distortion is called "triggered distortion" because it is deterministic; i.e., it depends on the input signal and is initiated under special conditions of the state variables (e.g. voice coil displacement). This triggered distortion may produce significant peak values for a short time in rare instances. However, the power in the mean is much smaller than that found with regular distortion caused by motor and suspension which has a steady-state characteristic. Performing a spectral analysis (FFT transform) is not a reliable way to detect triggered distortion because the energy of the triggered distortion is distributed over a large number of higher-order harmonics (>40), and the signal to noise ratio of each component is very low.

U.S. Pat. No. 5,884,260 discloses an invention which addresses this problem by measuring the envelope of the time signal using a filter bank; this approach is illustrated in FIG. 2. A signal generator 12 generates the stimulus for the system under test 14. A sensor or measurement input 16 provides its output to a filter bank 18, which contains multiple branches connected in parallel. Each branch comprises a band-pass filter 20, a rectifier 22 and a low-pass filter 24 connected in series. The pass bands of the band-pass filters and the time constants of the low-pass filters correspond with properties of the human auditory system. The band-pass filters have sufficient damping outside their pass-bands to separate the fundamental components from the harmonics. The amplitude and phase response of band-pass filters 20 and the time constants of the low-pass filters 24 changes the waveform of the analyzed signal and limits so as to detect signal distortion which is short in duration but high in amplitude. This method provides a pattern of the distortion which is relevant to human hearing, but is not comparable with other measurements and is hardly interpretable from an objective point of view.

The techniques known in the prior art fail if the triggered distortion or the symptoms of a malfunction or defect have less power than the measurement noise or the regular distortion caused by normal nonlinearities inherent in the system without any defects.

OBJECTS OF THE INVENTION

It is an objective of the invention to develop an arrangement and a method for measuring the signal distortion of a system more precisely, and for assessing the distortion quantitatively. The invention shall also reveal the relationship between signal distortion and the properties of the transferred signal and of the system. Excessive distortion having a small amplitude shall be detected in the presence of noise and regular distortion. The invention shall be realized by simple means and should be robust. The results shall be interpretable and comparable with other known methods. The invention shall be a basis for detecting irregular behavior, malfunctions and defects of a system automatically. Stochastic disturbances such as a loose connection or ambient noise shall be separated from deterministic distortion.

SUMMARY OF THE INVENTION

The objectives are reached by assessing the structure of the output signal's waveform in the time domain, and exploiting both amplitude and phase information. A signal source is required that provides an artificial test stimulus, music, or any other excitation signal x, to the input of the system. A signal y at the output of the system under test is monitored directly or by using special sensors. Both the excitation signal x and the measured system output y are supplied to an error system. The error system produces an error signal e that describes the instantaneous distortion in the full temporal resolution. The signal e is supplied to an assessment system, where it is transformed into convenient distortion measures and its dependency on properties of the input or output signal or any other state variable of the system under test is investigated. These properties may be known by using a deterministic excitation signal x, or are provided by a signal analyzer supplied with the input signal x or the output signal y. The assessment system may have an assessment output where the quality of the system or defects may be indicated. The assessment system may induce the signal generator to change the properties of the stimulus to ensure an optimal excitation of the system and to increase the reliability of the assessment.

The signal e is generated in the error system by modeling the transfer properties of the system under test. There are two embodiments of the invention:

In one embodiment, there is a model system that estimates the undesired or disturbing properties of the system under test and generates the error signal e directly.

In the alternative embodiment, the model system generates a desired output signal y' that considers all desired properties of the system under test. The difference between the measured system output y and the desired output y' provides the error signal e. In both embodiments, the properties of the model system depend on parameters which are estimated from the input signal x and the output signal y. The parameters of the model systems may be stored and averaged over multiple measurements.

This technique makes it possible to separate excessive distortion caused by a defect or a malfunction of the system from regular distortion caused by nonlinearities inherent in the normal system or any other desired properties of system. The error signal e preserves all of the phase and amplitude information of the distortion in the output y' of the system under test. No FFT, filtering, or any other transformation need be applied to separate the distortion. Small peaks or other transient distortion will be measured in their full temporal resolution and may be detected even if the energy is small.

BRIEF DESCRIPTION OF THE DRAWINGS

The following figures illustrate the objectives, advantages and embodiments of the invention.

DETAILED DESCRIPTION

Figure 1:
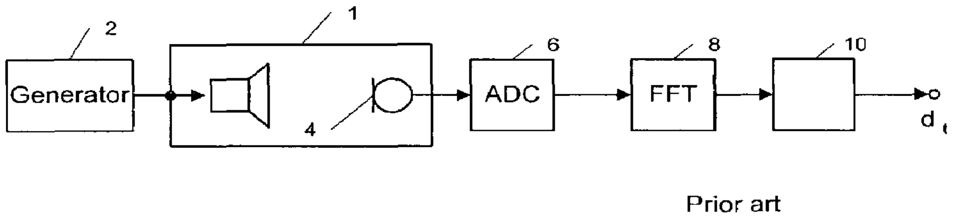
FIG. 1 is a block diagram of a known signal distortion measurement system.
Figure 2:
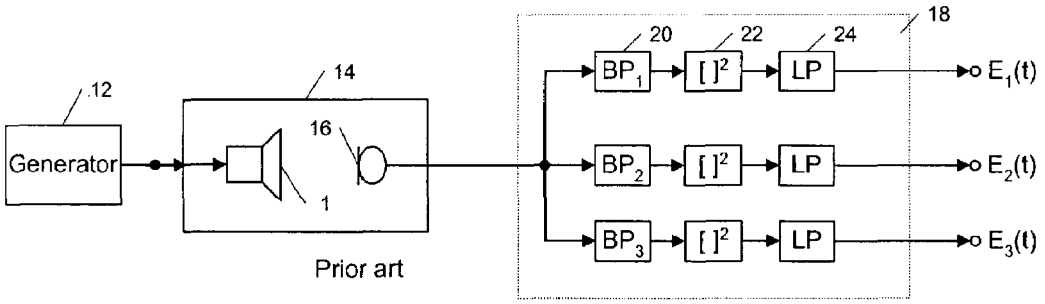
FIG. 2 is a block diagram of another known signal distortion measurement system.
Figure 3:
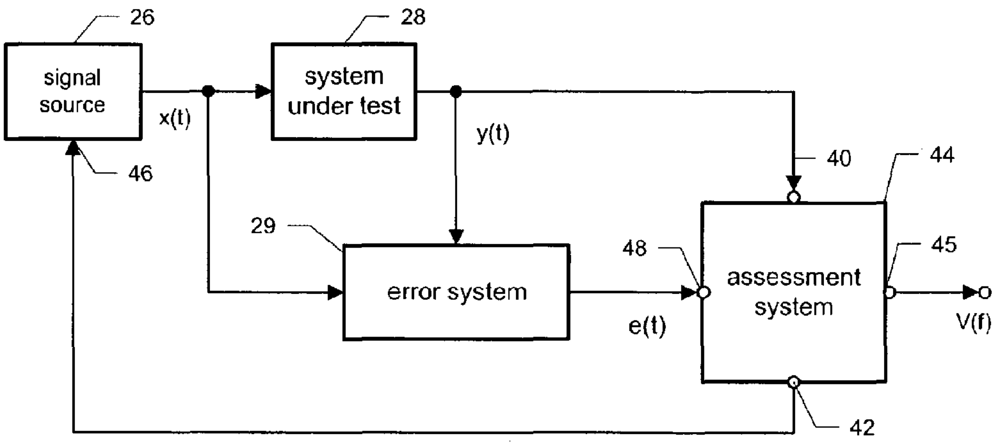
FIG. 3 is a block diagram of a signal distortion measurement and assessment system in accordance with the present invention.

FIG. 3 is a block diagram which illustrates the principles and signal flow of a signal distortion measurement and assessment system in accordance with the present invention. The arrangement includes a signal source 26, generating a stimulus x(t) supplied to the input of a system under test 28. The stimulus may be a stochastic or a deterministic signal. Noise, music, speech or any other natural audio signal are examples of a stochastic stimulus. A deterministic stimulus is usually an artificial test signal (sweep, tone, multi-tone complex) generated by a signal source.

System under test 28 produces an output signal y(t), which is using a sensor (not shown) and supplied to a first input of an error system 29. The error system has a second input which is provided with stimulus x(t) from signal source 26. The error system produces an error signal e(t) as an output.

The present system also includes an assessment system 44 having an input 48 connected to receive error signal e(t). The assessment system 44 transforms error signal e(t) into a distortion response V(f) at an output 45, or into any other distortion measure. This measure reveals the dependency of the distortion on instantaneous frequency f ("V(f)"), on the amplitude of the output signal y(t) ("V(y)"), or any other state variable related to the nonlinearity (e.g. instantaneous voice coil displacement). The assessment system 44 also generates a control signal S at a control output 42. Control signal S is dependent on the signal properties of y(t), and is supplied to a control input 46 of signal source 26. This control signal S may be used to change the properties (frequency, amplitude) of the stimulus to provide optimum excitation of the system under test.

Figure 4:
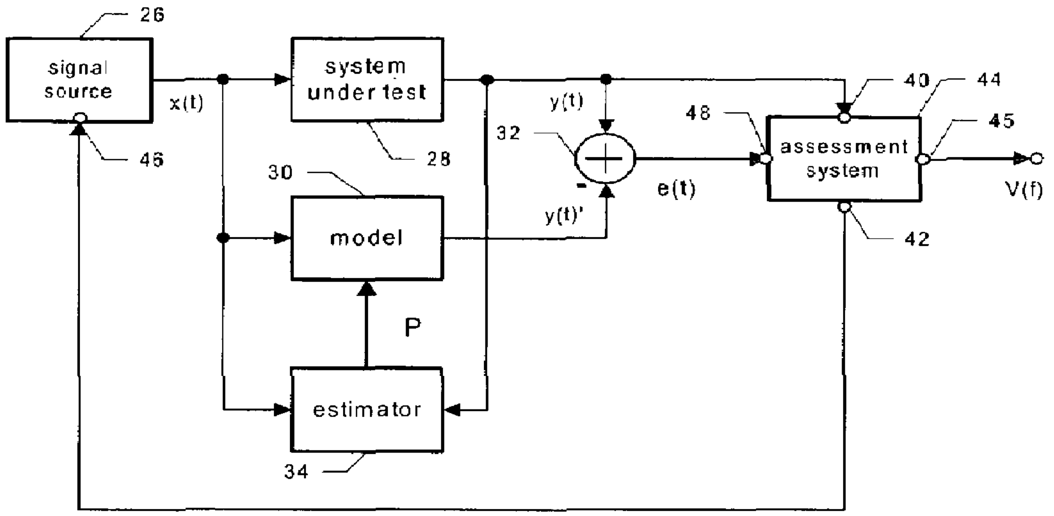
FIG. 4 is a block diagram of an error system as might be used in a signal distortion measurement and assessment system per the present invention.

FIG. 4 shows one possible embodiment of error system 29. The error system contains a model system 30, a subtraction circuit 32 and an estimator 34. The model system 30 receives stimulus x(t) at one input, and provides a desired output signal y(t)' to the first input of subtraction circuit 32. The second input of the subtraction circuit receives signal y(t) as measured at the output of system under test 28. The subtraction circuit 32 may be realized by a simple difference amplifier producing the error signal e(t) as the difference $$e(t)=y(t)-y'(t)$$

of the two input signals. The error signal e(t) reveals the instantaneous signal distortion versus time t, which depends on the properties of system under test 28, the properties of stimulus x(t), and the transfer properties of the model system 30. If model system 30 is a linear system which models the linear properties of the system under test, then all nonlinear effects of the system 28 contribute to error signal e(t). If model system 30 is a nonlinear system, then nonlinear distortion caused by regular nonlinearities may be generated in the desired signal y(t)' with the same amplitude and phase as in the measured signal y(t). The subtraction performed by subtraction circuit 32 causes a cancellation, or at least a reduction, of the regular distortion in e(t). Thus, error signal e(t) reveals the triggered distortion or any other excessive distortion components, even if their amplitudes are much smaller than the amplitude of the regular distortion.

Note that variables x, y, and e might alternatively be defined in the frequency domain, in which case error signal e(f) would be given by $$e(f)=y(f)-y'(f).$$

Model system 30 has a parameter input which receives a parameter vector P from estimator 34. The parameter vector changes the properties of model system 30, such as its linear transfer function H(f), impulse response h(t), or nonlinear characteristics. Estimator 34 generates the optimal parameter vector P to adjust model system 30 to the particular system under test. Estimator 34 is supplied with input signal x(t) and output signal y(t). To avoid a systematic bias, estimator 34 may model the total transfer behavior of the system under test, including the system nonlinearities, and then separate the desired properties in the parameter vector P. Estimator 34 may generate the parameters adaptively, or may average the parameter vectors from different realizations and then store an optimal vector P as a reference for other systems under test.

Figure 5:
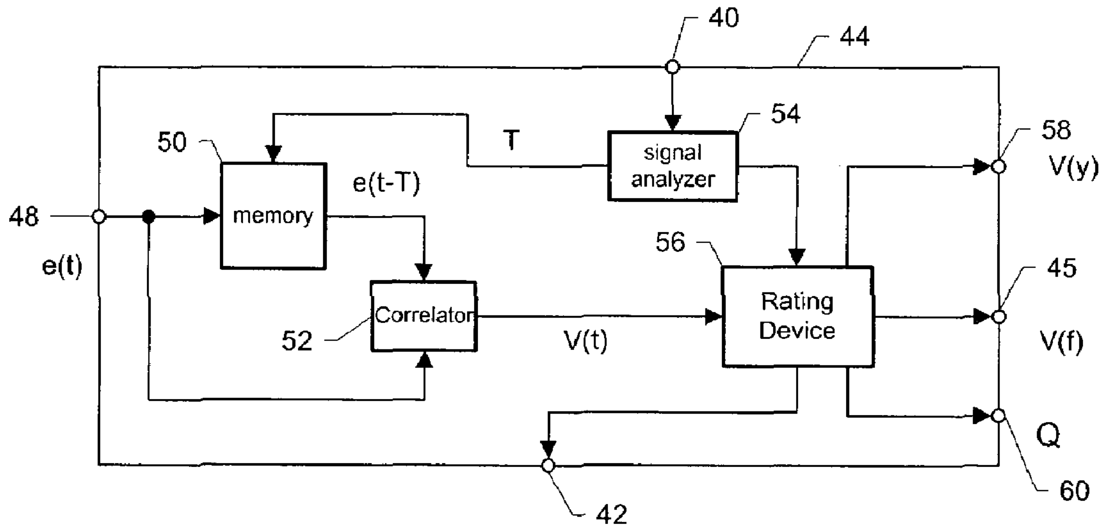
FIG. 5 is a block diagram of an assessment system as might be used in a signal distortion measurement and assessment system per the present invention.

FIG. 5 shows one possible embodiment for assessment system 44 in accordance with the invention. Assessment system 44 receives error signal e(t) at its input 48, and provides it to a storage or memory device 50 which produces a time delayed output signal e(t−T). The instantaneous error signal e(t) at input 48 and the delayed signal e(t−T) are supplied to a correlator 52, which produces the instantaneous distortion measure V(t).

If the stimulus is not periodical, or if the period T is not known, then the distortion measure V(t) may be calculated by $$V(t)=\frac{|e(t)|}{\sqrt{y(t)'^2+y_k(t)^2}}.$$

This is a relative measure which describes the ratio between the absolute value of the error signal e(t) and the envelope of the desired signal y'(t). The envelope is estimated by using the analytical signal $y_k(t)$, calculated by the Hilbert transform of the desired signal y(t)'.

If the signal source provides a deterministic signal x(t) with the known period T, then sequences of error signal e(t) may be compared with each other and additional distortion measures may be calculated:

The minimal value of the error signal searched over N periods:

$$V(t)=e_{\min}(t)=\min_{i=0}^{N-1}|e(t-iT)|$$

or the arithmetical mean value:

$$V(t)=\overline{e}(t)=\frac{1}{N}\sum_{i=0}^{N-1}|e(t-iT)|$$

are distortion measures which suppress stochastic disturbances (ambient noise, loose connection).

The maximal deviation of the error from the mean value:

$$V(t)=e_{\max}(t)=\max_{i=0}^{N-1}(|e(t-iT)|-\overline{e}(t))$$

may be used for the detection of stochastic disturbances (e.g. a loose electrical connection).

The instantaneous distortion measure V(t) is a function of time t, and depends on the properties of the instantaneous signal y(t). To simplify the interpretation of this measure, it is useful to replace the time by other signal properties such as frequency and amplitude. This mapping is accomplished by a rating device 56. If the stimulus is deterministic, then the relationship between some signal properties (instantaneous frequency, amplitude) and the time t is known a priori. If an arbitrary signal is used as stimulus, then a signal analyzer 54 is supplied with the output signal y(t) via input 40 to identify such properties. If signal analyzer 54 identifies a periodical signal, then the period T may be supplied to the memory 50. If the physical structure (nonlinear differential equation) of the system under test (loudspeaker) is known and provided as a priori information to signal analyzer 54, then important state variables (voice coil displacement x) may be identified. The identified information of the system (amplitude, frequency, state variables) are supplied to the rating device 56. Rating device 56 displays the instantaneous distortion as a function V(f) of instantaneous frequency f, as a function V(y) of instantaneous amplitude y, or as a function V(f,y) of both variables f and y. The function V(f,y) may be displayed as a three-dimensional plot and reveals the conditions (e.g., instant time, phase, polarity, dependency of y) for generating triggered distortion. This information are helpful to understand the physical cause (e.g., rubbing of the coil in the gap, hitting the back-plate, mechanical limiting of the suspension).

The rating device 56 may also produce control signal S at output 42, which is supplied to the control input of signal source 26 to generate a stimulus with optimal properties. Thus, the amplitude or the spectral content may be changed to ensure sufficient signal-to-noise ratio or to protect the device under test for an overload situation.

A signal produced by rating device 56 at output 60 describes the quality (Q) of the system under test quantitatively, by using a rating ($0<Q<1$) or a logical quantity (0=pass or 1=fail). Simple threshold and known identification algorithms may be used.

Figure 6:
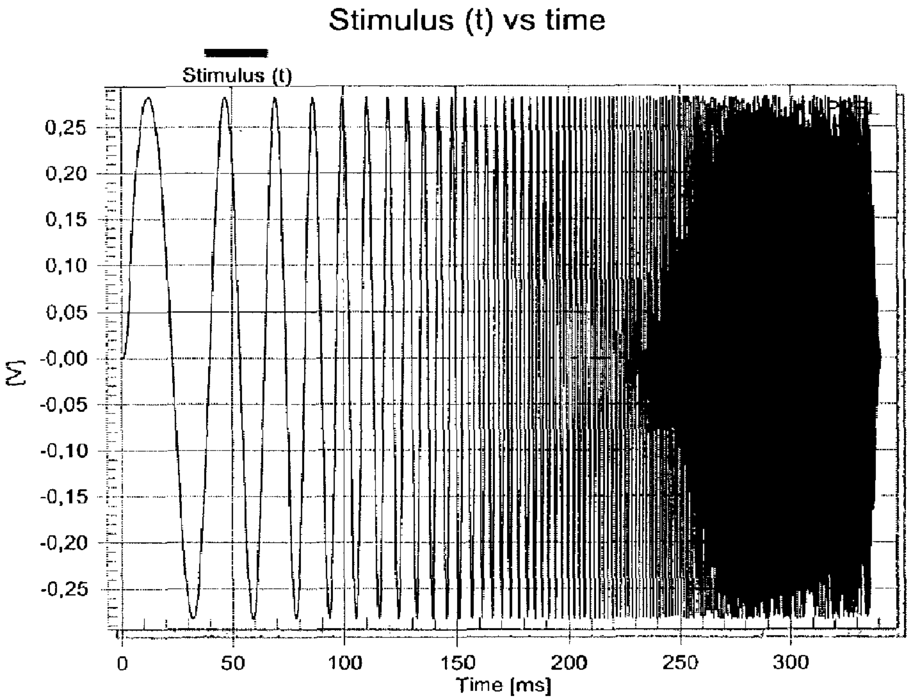
FIG. 6 is a plot of a sinusoidal excitation signal as might be used in a signal distortion measurement and assessment system per the present invention.

The following figures show aspects of the invention in greater detail:

FIG. 6 shows a sinusoidal sweep defined by:

$$x(t)=U_0\sin(2\pi f(t)t),$$

as an example of a deterministic stimulus, commonly used for the measurement of loudspeakers. The frequency f(t) varies steadily with time t. There is an exponential relationship between instantaneous frequency:

$$f(t)=f_{start}\alpha^t$$

and time t, using the starting frequency $f_{start}$, with the parameter a affecting the speed of frequency variation.

Figure 7:
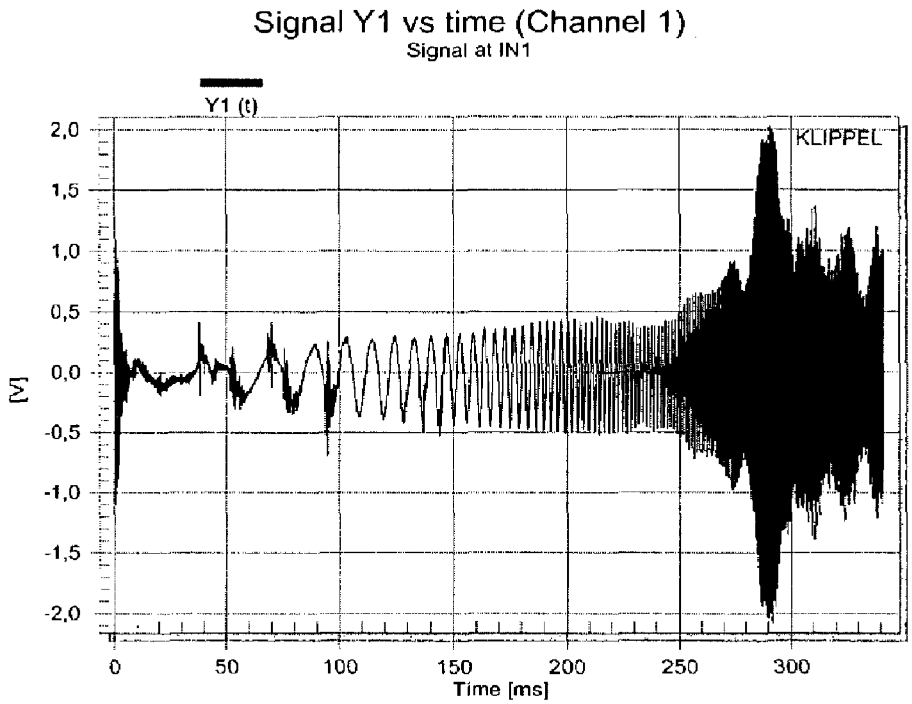
FIG. 7 is a plot of an exemplary output signal from a system under test.

FIG. 7 shows the sound pressure time signal y(t), measured in the near field of a loudspeaker excited by the stimulus x(t) in FIG. 6.

Figure 8:
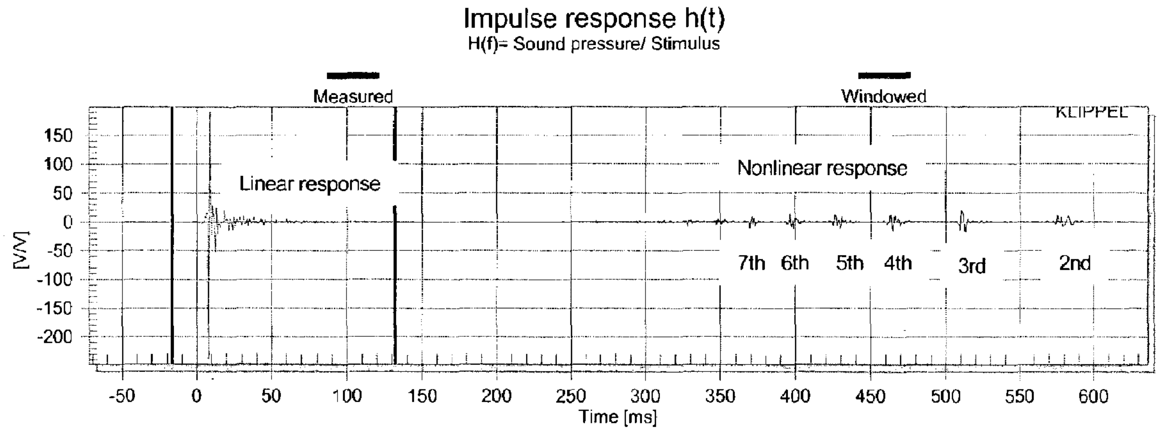
FIG. 8 depicts linear and nonlinear parameters as might be calculated by an estimator system per the present invention.

FIG. 8 shows the identified linear and nonlinear parameters, calculated by:

$$h(t)=FT^{-1}\left\{\frac{FT\{y(t)\}}{FT\{x(t)\}}\right\}$$

in estimator 34. This equation is the inverse Fourier transform of the ratio of the Fourier-transformed sound pressure output y(t) and the sinusoidal sweep input x(t). It reveals the impulse response of the fundamental and harmonic components. Due to the logarithmical increase of instantaneous frequency versus time t, the impulse responses are separated in h(t) and may be assessed by windowing. By using a rectangular windowing function defined by:

$$w(t)=\begin{Bmatrix}1 & t_1\le t\le t_2\\ 0 & 0\le t\le t_1\\ 0 & t_2\le t\le T\end{Bmatrix}$$

the desired part of the impulse response:

$$h_{mod}(t)=w(t)\cdot h(t)$$

may be extracted from h(t). If all the effects of the nonlinearities inherent in system under test 28 are considered as undesired distortion, and only the variation of the linear amplitude and phase response are considered acceptable, then the limits $t_1$ und $t_2$ of the window function w(t) are adjusted in such a way that only the linear part of the impulse response is considered in the model system 30. Thus, only the fundamental components are generated by 30 and are removed from the error signal e(t).

If some of the harmonics are considered as regular distortion which is typical for the particular system under test, then the corresponding nonlinear impulse responses have to be assigned to the model system 30.

Figure 9:
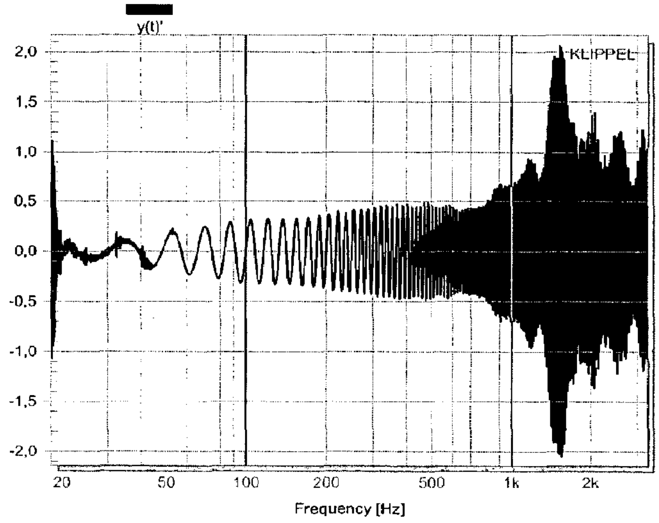
FIG. 9 is a plot of the desired output signal which should result from the sinusoidal excitation signal shown in FIG. 6.

FIG. 9 shows the desired signal:

$$y'(t)=h_{mod}(t)*x(t)$$

generated by convolution of the windowed impulse response $h_{mod}(t)$ with the stimulus x(t) in the model system 30.

The difference between the measured and estimated signal provides the error signal:

$$e(t)=y(t)-y'(t).$$

Alternatively, the error signal:

$$e(t)=(h(t)-w(t)\cdot h(t))*x(t)=((1-w(t))\cdot h(t))=(w'(t)\cdot h(t))*x(t)$$

may be generated by the convolution of the windowed impulse response h(t) using the distortion window $$w'(t)=1-w(t)=\begin{Bmatrix}0 & t_1\le t\le t_2\\ 1 & 0\le t\le t_1\\ 1 & t_2\le t\le T\end{Bmatrix}$$

with the excitation signal x(t).

Figure 10:
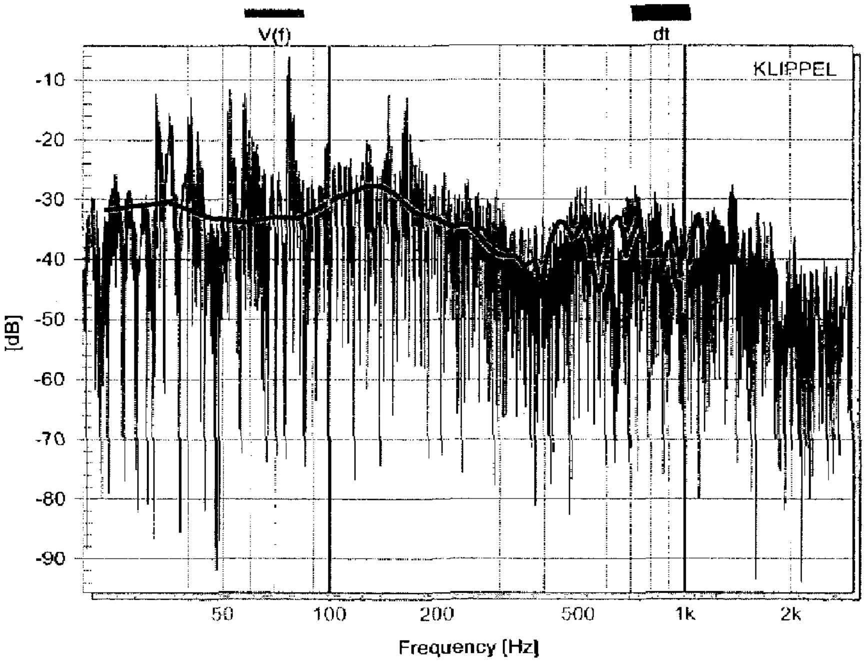
FIG. 10 is a plot showing distortion V(f) and total harmonic distortion $d_t(f)$ as a function of the instantaneous frequency f.

The thin curve in FIG. 10 shows the distortion measure V(f) as a function of the instantaneous frequency f. The bold curve in FIG. 10 shows the total harmonic distortion in percent according IEC 60268:

$$d_t(f)=\sqrt{\frac{Y(2f)^2+Y(3f)^2+\ldots+Y(Nf)^2}{Y(f)^2+Y(2f)^2+Y(3f)^2+\ldots+Y(Nf)^2}}*100,$$

using the Fourier transformed output signal $$Y(f)=FT\{y(t)\}.$$

The total harmonic distortion $d_t(f)$ describes the mean power of the harmonic distortion related to the total signal, but neglects the phase of the signal components which determine the peak value of the instantaneous distortion. If the nonlinearities of the system under test can be represented primarily by low-order nonlinearities (e.g., with quadratic, cubic characteristics), then the total harmonic distortion $d_t(f)$ is comparable with the instantaneous distortion V(f). This is the case in the particular system under test in FIG. 10 for frequencies above 200 Hz. The peak values of the instantaneous distortion V(t) are 6-10 dB above the total harmonic distortion $d_t$. Below 100 Hz, the system 28 produces very short disturbances with high peak values in V(f) below 100 Hz, which are up to 30 dB above the total harmonic distortion. In this example, the high crest factor of the harmonic distortion is caused by a loose glue joint in the mechanical system of loudspeakers. The rating system 56 compares the instantaneous V(f) with a threshold $V_s(f)=-20$ dB, and reports a defect at the assessment output 60.

Figure 11:
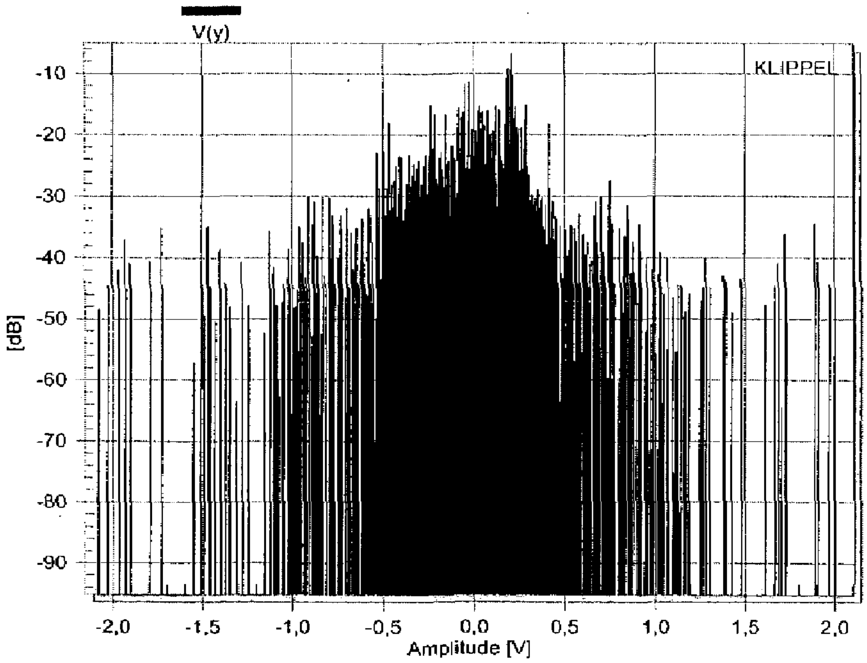
FIG. 11 is a plot showing instantaneous distortion V(y) as a function of the instantaneous signal amplitude y(t).

FIG. 11 shows the instantaneous distortion V(y) as a function of the instantaneous signal amplitude y(t).

The above description shall not be construed as limiting the ways in which this invention may be practiced but shall be inclusive of many other variations that do not depart from the broad interest and intent of the invention.

We claim:

1. An arrangement for measuring and assessing properties of a system (28) which transfers an electrical, acoustical or mechanical signal or converts such a signal into an arbitrary signal, whereas the system has at least one signal input and at least one signal output, said at least one signal output including an expected nonlinear distortion component due to nonlinearities inherent in said system and an excessive nonlinear distortion component which arises due to system defects, comprising:

a signal source (26) which provides an excitation signal x(t) to said system's at least one signal input, an error system (29) having a first input connected to receive the excitation signal provided to said system's at least one signal input and a second input connected to receive one of said system's at least one signal outputs y(t), said error system arranged to produce an instantaneous error signal e(t) at an error output, said error system arranged such that e(t) indicates the excessive nonlinear distortion component present in signal output y(t) at any time instance, and an assessment system (44) having at least one input connected to receive said error signal and having at least one assessment output (45), said assessment system arranged to indicate the quality and/or properties and/or malfunctions of said system.

2. The arrangement of claim 1, wherein said error system comprises:

a model system (30) having a model input connected to receive said excitation signal x(t), a model system output y(t)', and a parameter input, said model system arranged such that its transfer properties are varied by changing the parameters P applied at said parameter input such that P describes said system's expected nonlinear distortion component for said excitation signal x(t) and said signal output y(t), and an estimator (34) connected to receive said excitation signal x(t) and signal output y(t) at respective inputs, and arranged to generate said parameter P.

3. The arrangement of claim 2, wherein said error system comprises a subtraction circuit (32) having a first input connected to receive signal output y(t) and a second input connected to receive model output y(t)' and arranged to produce said error signal e(t)=y(t)−y(t)' as the difference of its two input signals.

4. The arrangement of claim 1, wherein said assessment system includes a signal analyzer (54) having an input connected to receive said signal output y(t) and is arranged to produce an analyzer output which describes said excessive nonlinear distortion versus instantaneous frequency f and/or amplitude and/or other state variables of signal output y(t).

5. The arrangement of claim 4, wherein said excessive nonlinear distortion component may contain a deterministic portion and a random portion and said signal source (26) generates a deterministic excitation signal x(t) repeated periodically, wherein the assessment system comprises:

a memory (50) having an input which receives error signal e(t) and which is arranged to produce a delayed error signal e(t−T) at an output, and a correlator (52) which receives e(t) and e(t−T) at respective inputs and which is arranged to produce an instantaneous distortion measure output V(t) where the random distortion portion of said excessive nonlinear distortion component is separated from said deterministic distortion portion.

6. The arrangement of claim 1, wherein said signal source generates a sinusoidal tone having a frequency which varies with time.

7. The arrangement of claim 1, wherein said signal source receives a control signal S from said assessment system at an input and is arranged to modify the properties of excitation signal x(t) in response to said control signal, wherein said control signal S depends on the properties of said signal output y(t).

8. A method for measuring and assessing properties of a system (28) which transfers an electrical, acoustical or mechanical signal or converts such a signal into an arbitrary signal, whereas the system has at least one signal input and at least one signal output, said at least one signal output including an expected nonlinear distortion component due to nonlinearities inherent in said system and an excessive nonlinear distortion component which arises due to system defects, comprising:

generating an excitation signal and providing it to the signal input of the system, sensing said at least one signal output y(t), modeling the transfer behavior of said system to determine the expected nonlinear distortion component y(t)' present in said system's at least one signal output y(t), and subtracting y(t)' from y(t) to produce an error signal e(t) which describes said excessive nonlinear distortion component present in y(t) for any time instant t.

9. The method of claim 8, wherein said error signal e(t) includes a random time response portion and a deterministic time response portion, further comprising:

repeating said generating, sensing, modeling and subtracting steps to obtain different realizations of error signal e(t), and separating the random from the deterministic time response in error signal e(t).

10. The method of claim 8, further comprising:

generating a distortion measure V(f) by analyzing the dependency of the error signal e(t) on instantaneous frequency f and/or the output amplitude of said at least one signal output y(t) and/or other state variables of said system.

11. The method of claim 8, further comprising:

estimating an optimal parameter vector P such that P describes said system's expected nonlinear distortion component for said excitation signal x(t) and said signal output y(t), and adjusting the modeling of said system using said parameter vector P.

* * * * *